United States Patent
Jeong et al.

(10) Patent No.: US 7,341,809 B2
(45) Date of Patent: Mar. 11, 2008

(54) PHOTOMASK, METHOD FOR MANUFACTURING THE SAME, AND METHOD FOR MEASURING OPTICAL CHARACTERISTICS OF WAFER EXPOSURE SYSTEM USING THE PHOTOMASK DURING OPERATION

(75) Inventors: Tae-moon Jeong, Yongin (KR);
Seong-hyuck Kim, Seoul (KR);
Seong-woon Choi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/432,963

(22) Filed: May 12, 2006

(65) Prior Publication Data

US 2006/0204864 A1  Sep. 14, 2006

Related U.S. Application Data (62) Division of application No. 10/383,192, filed on Mar. 6, 2003, now Pat. No. 7,070,891.

(30) Foreign Application Priority Data

Mar. 12, 2002 (KR) .................................. 02-13263

(51) Int. Cl.
*G03F 9/00* (2006.01)

(52) U.S. Cl. ............................................. 430/5; 430/30
(58) Field of Classification Search ................... 430/5, 430/30
See application file for complete search history.

(56) References Cited

U.S. PATENT DOCUMENTS

| | | | | |
|---|---|---|---|---|
| 5,658,696 | A | * | 8/1997 | Hur ................................ 430/5 |
| 6,042,972 | A | | 3/2000 | Schulze ......................... 430/5 |
| 6,171,739 | B1 | | 1/2001 | Spence et al. ................ 430/30 |
| 6,866,975 | B2 | | 3/2005 | Wu ................................ 430/30 |
| 7,070,891 | B2 | * | 7/2006 | Jeong et al. .................. 430/30 |
| 7,172,841 | B2 | * | 2/2007 | Taniguchi et al. ............. 430/5 |

* cited by examiner

*Primary Examiner*—Christopher G. Young
(74) *Attorney, Agent, or Firm*—Mills & Onello LLP (57) ABSTRACT

Provided are a photomask, a method for manufacturing the photomask and a method for measuring optical characteristics of a wafer exposure system, the measuring method using the photomask during manufacture. The photomask includes a substrate and a measuring pattern including a light opaque region pattern formed on the substrate and a plurality of light transmitting region patterns that are formed in regions divided by the light opaque region pattern and provoke phase shifts to provide phase differences to light transmitted through light transmitting regions. Precise measurements of the degree of a focus and lens aberrations of an exposure system using the photomask are obtained.

14 Claims, 11 Drawing Sheets

PHOTOMASK, METHOD FOR MANUFACTURING THE SAME, AND METHOD FOR MEASURING OPTICAL CHARACTERISTICS OF WAFER EXPOSURE SYSTEM USING THE PHOTOMASK DURING OPERATION

CROSS-REFERENCE OF RELATED APPLICATIONS

This application is a divisional of U.S. application Ser. No. 10/383,192, filed on Mar. 6, 2003, now U.S. Pat. No. 7,070,891 which relies for priority upon Korean Patent Application No. 2002-0013263, filed on Mar. 12, 2002, the contents of which are herein incorporated by reference in their entirety.

BACKGROUND OF THE INVENTION

1. Field of the Invention

The present invention relates to manufacture of a semiconductor device, and more particularly, to a photomask used in a photolithography process for manufacturing a semiconductor device, a method for manufacturing the same and a method for measuring optical characteristics of a wafer exposure system, such as focus, lens aberration, etc., using the photomask during the operation.

2. Description of the Related Art

Recently, as a critical dimension (CD) in a device during manufacture of a semiconductor device becomes strict, patterns to be exposed are greatly influenced by distributions of lens focus and aberrations. Accordingly, understanding and controlling the distributions of the lens focus and aberrations during operation of the exposure system is recognized as being very important.

Until now, the methods for measuring or detecting a degree of focus of the exposure system have concentrated on measuring a CD of a real pattern on a real wafer according to the defocus of the exposure system using a scanning electron microscope, or measuring shifts of the patterns according to the defocus using overlay measuring equipment. However, it is known to be very difficult to precisely measure focus of the exposure system with the method for measuring a CD of a real pattern using a scanning electron microscope. That is, it is possible to measure a CD of a real pattern using a scanning electron microscope, but it is difficult to determine if the CD measured by this method represents the exact degree of a focus of the exposure system.

In addition, it is known that the method for measuring an overlay can measure a degree of focus of the exposure system relatively precisely, but presents difficulties in manufacturing a photomask for patterns observed with the overlay measurement equipment. Patterns for measuring an overlay are manufactured much larger than the patterns for the real devices. Accordingly, in the case of manufacturing a photomask corresponding to the patterns for measuring an overlay, a considerably large pattern should be manufactured on the photomask. It is known that the adhesiveness between a quartz blank and photoresist for a photomask is poor. Therefore, since a photoresist pattern should cover a large region on the quartz blank to manufacture a photomask including a large pattern, it occurs quite often that photoresist patterns are lifted when the photoresist patterns are exposed or developed.

Therefore, there is a need for a method for measuring or detecting optical characteristics such as focus or lens aberrations of the exposure system during manufacture of a semiconductor device, and a photomask used in the method.

SUMMARY OF THE INVENTION

It is an object of the present invention to provide a photomask used in measuring or detecting optical characteristics such as focus or lens aberrations of an exposure system more precisely during manufacture of a semiconductor device, and a method for manufacturing the same.

It is another object of the present invention to provide a method for measuring or detecting optical characteristics, such as focus or lens aberrations of the exposure system, more precisely during manufacture of a semiconductor device, using the photomask.

A photomask in accordance with the invention includes a substrate and a measuring pattern. The measuring pattern includes a light opaque region pattern formed on the substrate and a plurality of light transmitting region patterns that are formed in regions divided by the light opaque region pattern and provoke phase shifts to provide phase differences to light transmitted through light transmitting regions.

A plurality of the measuring patterns may be disposed on the substrate. The light opaque region patterns may be made of chrome layers. The phase difference may be 90°.

Alternatively, the photomask may include a substrate and a measuring pattern including a light opaque region pattern in a cross-shape formed on the substrate, and four light transmitting region patterns that are formed in four quadrants, respectively, divided by the light opaque region pattern and provoke phase shifts to provide phase differences to light transmitted through light transmitting regions.

Here, one of the light transmitting region patterns may be composed of a surface of one quadrant of the substrate and the other light transmitting region patterns are made of grooves with different depths on the other quadrants of the substrate.

In accordance with another aspect of the present invention, a method for manufacturing a photomask includes forming a light opaque region pattern on a substrate and forming a measuring pattern that comprises a light opaque region pattern and light transmitting region patterns, by forming a plurality of light transmitting region patterns that are formed in the regions divided by the light opaque region pattern and provoke phase shifts to provide the phase differences to the light transmitted through the regions.

Alternatively, the method for manufacturing a photomask includes forming a cross-shaped light opaque region pattern on the substrate and forming a measuring pattern that comprises four light transmitting region patterns formed in four quadrants divided by the light opaque region pattern and provoke phase shifts to provide phase differences to the light transmitted through the regions.

Forming the light transmitting region patterns can include setting one of the four quadrants as a light transmitting region pattern and sequentially etching portions of the other quadrants of the substrate to different thicknesses to sequentially form other light transmitting region patterns with grooves having different depths.

In accordance with another aspect of the present invention, there is provided a method for measuring focus of a wafer exposure system during a manufacture of a semiconductor device, using a photomask including a measuring pattern that includes a plurality of light transmitting region patterns divided by a light opaque region pattern on a substrate and provoke phase shifts to provide phase differences to light transmitting the region patterns. The method includes performing a photolithography process to transfer the patterns based on the measuring patterns on the wafer; measuring degrees of shifts of the transferred patterns on the wafer; and measuring focus of an exposure system within the degrees of the shifts of the transferred patterns.

Preferably, the light opaque region pattern formed in a cross shape, dividing the four quadrants of the light transmitting region patterns, and the degrees of shifts of the transferred pattern are measured from a degree of relative shift of a certain transferred pattern to the other light transmitting region patterns of the quadrant regions. Preferably, one of the light transmitting region patterns is made of one of the four quadrants of the substrate, and the other light transmitting region patterns are made of grooves with different depths on the other quadrants of the substrate. Preferably, the degree of shift of the transferred patterns is measured from the transferred patterns, based on the light transmitting region patterns of the quadrant regions in the up/down, left/right or one of the directions during manufacture.

Preferably, the method includes disposing a plurality of the measuring patterns on the substrate of the photomask, measuring the degrees of the shifts of the transferred patterns based on the disposed measuring patterns, and obtaining a focus map for all regions on the wafer corresponding to the photomask.

Preferably, the method further includes transferring the patterns with variation of focus of the exposure system and measuring several times the degree of shifts of the transferred patterns and obtaining an optimum focus of the exposure system.

Preferably, measuring the degree of shifts of the transferred patterns is performed by observing the transferred patterns with a scanning electron microscope.

In accordance with another aspect of the present invention, there is provided a method for measuring aberration of a wafer exposure system, during a manufacture of a semiconductor device. The method uses a photomask including measuring patterns that include a plurality of light transmitting region patterns divided by a light opaque region pattern on a substrate and provoke phase shifts to provide phase differences to lights transmitted through the region patterns. The method includes performing a photolithography process on a wafer to transfer the patterns based on the measuring patterns on the wafer; measuring a degree of shift of the transferred patterns on the wafer; and measuring a focus of an exposure system from the degree of the shift of the transferred patterns.

Preferably, the light opaque region is formed in a cross shape dividing the four quadrants of the patterns for light transmitting regions and the degree of shift of the transferred patterns are measured from the degree of shift of the transferred patterns based on the light transmitting region patterns of the quadrant regions. Preferably, one of the light transmitting region patterns is made of one of the four quadrants of the substrate, and the other light transmitting region patterns are made of grooves with different depths on the other quadrants of the substrate. Preferably, the degree of shift of the transferred patterns is measured from the transferred patterns, based on the light transmitting region patterns of the quadrant regions in the up/down, left/right or one of the directions during manufacture.

Preferably, the method further includes disposing a plurality of measuring patterns on the substrate of the photomask, measuring the degree of the shift of the transferred patterns based on the disposed measuring patterns and obtaining an aberration map for all regions on the wafer corresponding to the photomask.

Preferably, the method further includes transferring the patterns with variation of aberration of the exposure system and measuring several times the degree of shifts of the transferred patterns and obtaining an optimum aberration of the exposure system. Here, the aberration may be an astigmatism aberration.

Preferably, measuring the degree of shifts of the transferred pattern is performed by observing the transferred pattern with a scanning electron microscope.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention now will be described more fully with reference to the accompanying drawings, in which preferred embodiments of the invention are shown. In the drawings, the thickness of layers and regions are exaggerated for clarity. It will also be understood that when a layer is referred to as being "on" another layer or a substrate, it can be directly on the other layer or the substrate, or intervening layers may also be present.

The method for measuring optical characteristics of an exposure system, such as focus and lens aberration, adapts a phase shift-type photomask, and measures the focus and the lens aberration by measuring the shifts of the patterns transferred on the wafer by the phase shift-type photomask with a scanning electron microscope. More precisely, an embodiment of the present invention provides a photomask that includes patterns for measuring shifts of the patterns transferred by the exposure system.

Figure 1:
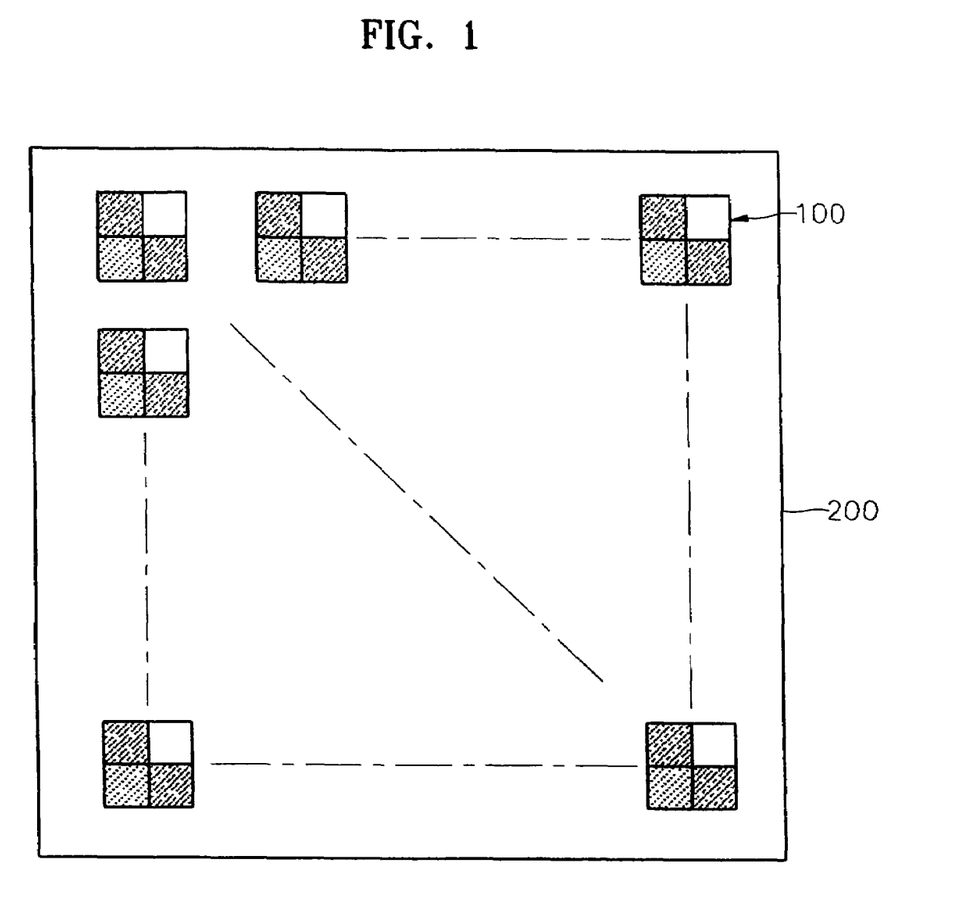
FIG. 1 is a schematic view of a photomask according to an embodiment of the present invention.

Referring to FIG. 1, a first embodiment of the present invention includes a plurality of measuring unit patterns 100. It is possible to dispose the plurality of measuring unit patterns 100 within a region of the photomask. The measuring unit patterns 100 are formed on a photomask substrate 200 by photo exposures and selective etch.

Figure 2:
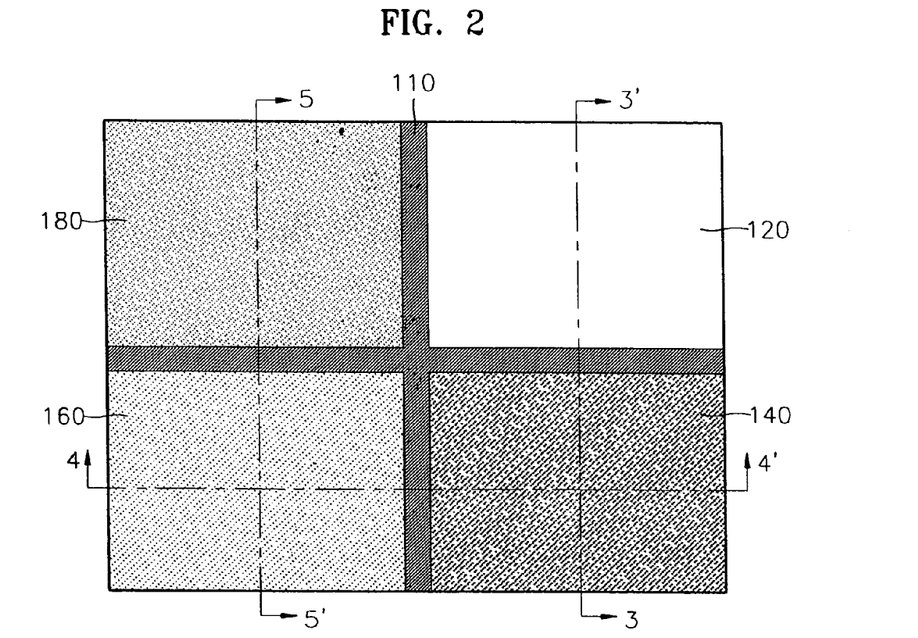
FIG. 2 is a plane view of a unit pattern adapted in a photomask according to the embodiment of the present invention.
Figure 3:
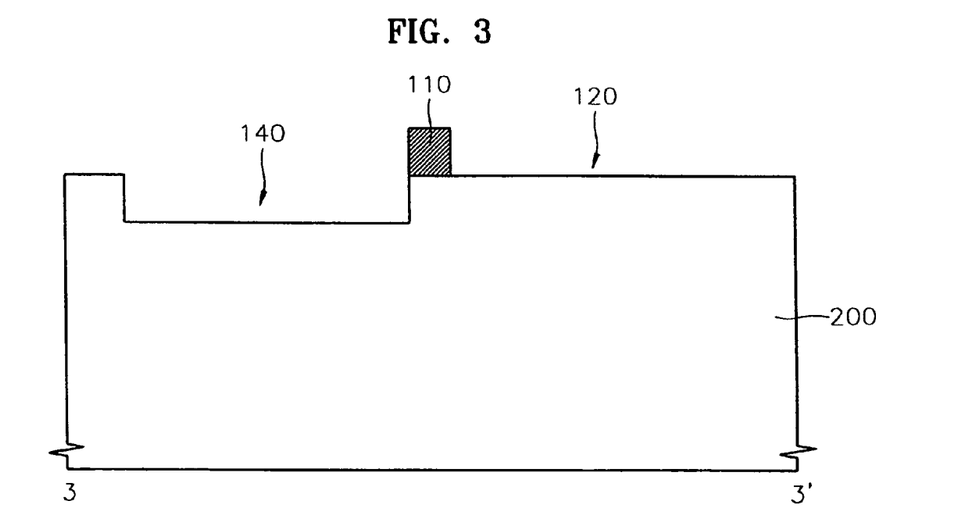
FIG. 3 is a cross-sectional view along the cutting plane line 3-3' in FIG. 2 to show a unit pattern adapted in a photomask according to the embodiment of the present invention.
Figure 4:
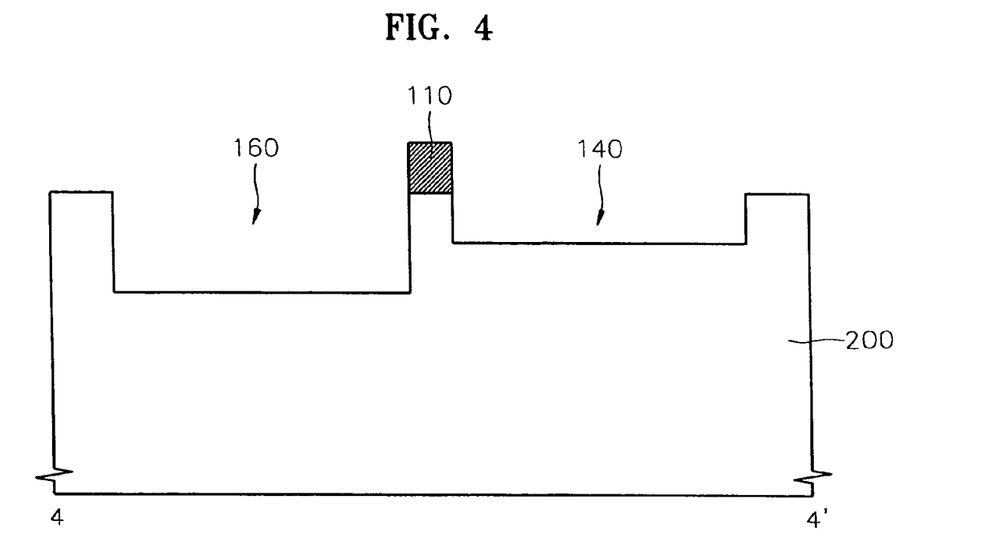
FIG. 4 is a cross-sectional view along the cutting plane line 4-4' in FIG. 2 to show a unit pattern adapted in a photomask according to the embodiment of the present invention.
Figure 5:
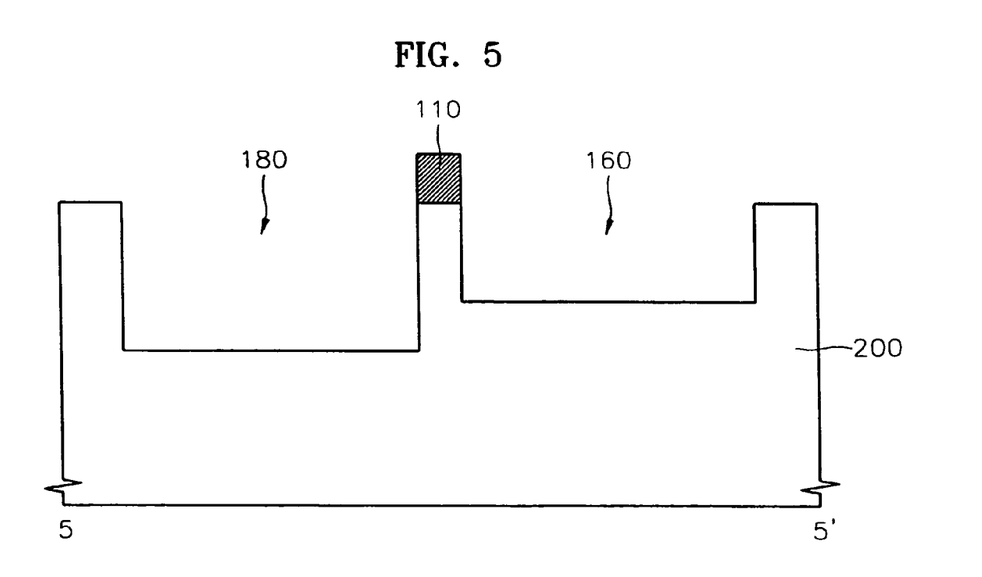
FIG. 5 is a cross-sectional view along the cutting plane line 5-5' in FIG. 2 to show a unit pattern adapted in a photomask according to the embodiment of the present invention.

FIG. 2 is a plane view of a unit pattern adapted in a photomask according to an embodiment of the present invention. FIG. 3 is a cross-sectional view along the cutting plane line 3-3' in FIG. 2 to show a unit pattern adapted in a photomask according to an embodiment of the present invention. FIG. 4 is a cross-sectional view along the cutting plane line 4-4' in FIG. 2 to show a unit pattern adapted in a photomask according to an embodiment of the present invention. FIG. 5 is a cross-sectional view along the cutting plane line 5-5' in FIG. 2 to show a unit pattern adapted in a photomask according to an embodiment of the present invention.

Referring to FIG. 2, the measuring unit pattern 100 includes a light opaque region pattern 110 and light transmitting region patterns 120, 140, 160, and 180, divided by the light opaque region pattern 110.

In one embodiment, the light opaque region pattern 110 is made of a chrome pattern that is deposited and patterned on a photomask substrate 200, for example, a transparent quartz substrate as shown in FIGS. 3 through 5. The light opaque region pattern 110 is formed in a cross-shape to be used as a boundary dividing a plurality of light transmitting region patterns 120, 140, 160, and 180 consisting of four divided region patterns.

The light transmitting region patterns 120, 140, 160, and 180, divided by the light opaque region pattern 110, are each designed for transmitting light to have different phases. That is, the four light transmitting region patterns 120, 140, 160, and 180 are classified clockwise as the first, second, third and fourth quadrant, respectively. A transmitting light phase shifts by 0° in the first light transmitting region pattern 120 of the first quadrant, 90° in the second light transmitting region pattern 140 of the second quadrant, 180° in the third light transmitting region pattern 160 of the third quadrant, and 270° in the fourth light transmitting region pattern 180 of the fourth quadrant. It is preferable that each light transmitting region pattern 120, 140, 160, and 180 have a phase difference of 90° to each previous pattern.

The light transmitting region patterns 120, 140, 160, and 180, are prepared as phase shift regions to give phase differences to the light transmitted by each region. For example, as shown in FIGS. 2 through 5, the light transmitting region patterns 120, 140, 160, and 180 are formed on the substrate, by forming the light opaque region pattern 110 into a chrome pattern with the photolithography process and then opening the regions and etching them sequentially. At this time, the first light transmitting region pattern 120 is formed naturally by not etching the first quadrant.

It is preferable that an etching thickness of the substrate 100 in the second quadrant be set so that the light transmitted through the second light transmitting region pattern 140 has a phase difference of 90° from the light transmitted through the first light transmitting region pattern 120 of the first quadrant.

Next, as shown in FIG. 4, after opening the third quadrant and etching the substrate 200 into the third quadrant of a different thickness from the etching thickness in the second quadrant and then the third light transmitting region pattern 160 is formed. At this time, it is preferable that an etching thickness of the substrate 100 in the third quadrant be set so that the light transmitted through the third light transmitting region pattern 160 have a phase difference of 90° from the light transmitted through the second light transmitting region pattern 140 of the second quadrant. In addition, an etching thickness of the substrate 100 in the third quadrant is set so that the light transmitted through the third light transmitting region pattern 160 has a phase difference of 180° from the light transmitted through the first light transmitting region pattern 120 of the first quadrant.

Next, as shown in FIG. 5, after opening the fourth quadrant, etching the substrate 200 into the fourth quadrant of a different thickness from the etching thickness in the third quadrant and then the fourth light transmitting region pattern 180 is formed. At this time, it is preferable that an etching thickness of the substrate 100 in the fourth quadrant is set so that the light transmitted through the fourth light transmitting region pattern 180 has a phase difference of 90° from the light transmitted through the third light transmitting region pattern 160 of the third quadrant. In addition, an etching thickness of the substrate 100 in the fourth quadrant is set so that the light transmitted through the fourth light transmitting region pattern 180 has a phase difference of 270° from the light transmitted through the first light transmitting region pattern 120 of the first quadrant.

The measuring unit pattern 100 is designed to observe more precisely the shifts of the patterns on the wafer more precisely by optical characteristics, such as a degree of focus or lens aberration, by inducing phase differences to the lights transmitted through the light transmitting region patterns 120, 140, 160, and 180, respectively. FIG. 2 shows an example of forming the light opaque region pattern 110 in a cross-shape to divide the four quadrants, and the light opaque region pattern 110 is shifted to separate multiple quadrants, i.e., quadruple quadrants, if required. That is, the light opaque region pattern 110 is shifted to divide eight quadrants.

The measuring unit pattern 100 is disposed so that a plurality of photomasks are distributed as shown in FIG. 1. It is possible to measure a single measuring unit pattern 110 in case of simply measuring a degree of focus of the exposure system. However, in the case of obtaining an entire degree of a focus by obtaining a focus map throughout the entire regions of the wafer, or obtaining an entire degree of aberrations by obtaining an aberration map throughout the entire region exposed on the wafer, it is possible to dispose a plurality of measuring unit patterns 100 on the entire regions of the photomask. At this time, it is possible to obtain both the degree of focus or lens aberration of the exposure system in each regions corresponding to the measuring unit patterns 100. By collecting the above degrees of the focus or lens aberrations, it is possible to obtain a focus map and an aberration map. It is possible to obtain the optimum optical characteristics, such as the degree of focus or lens aberration by obtaining the focus map or the aberration map and to feed back them in the wafer exposure process.

As described above, a method for measuring the optical characteristics, such as the degree of focus or lens aberration, is illustrated by using a photomask including the measuring unit pattern 100.

At first, exposures and developments are performed on the photoresist layer on the wafer according to changes of the focus of the photo exposure equipment by using the photomask as shown in the embodiments of the present invention. At this time, what is really observed with a scanning electron microscope is a developed wafer, namely, a developed photoresist layer. What is to be observed with the scanning electron microscope is a pattern formed by transferring the measuring unit pattern 100. The patterns formed on the wafer by corresponding to the measuring unit pattern 100 observed by the scanning electron microscope are as shown in FIGS. 6 through 8.

Figure 6:
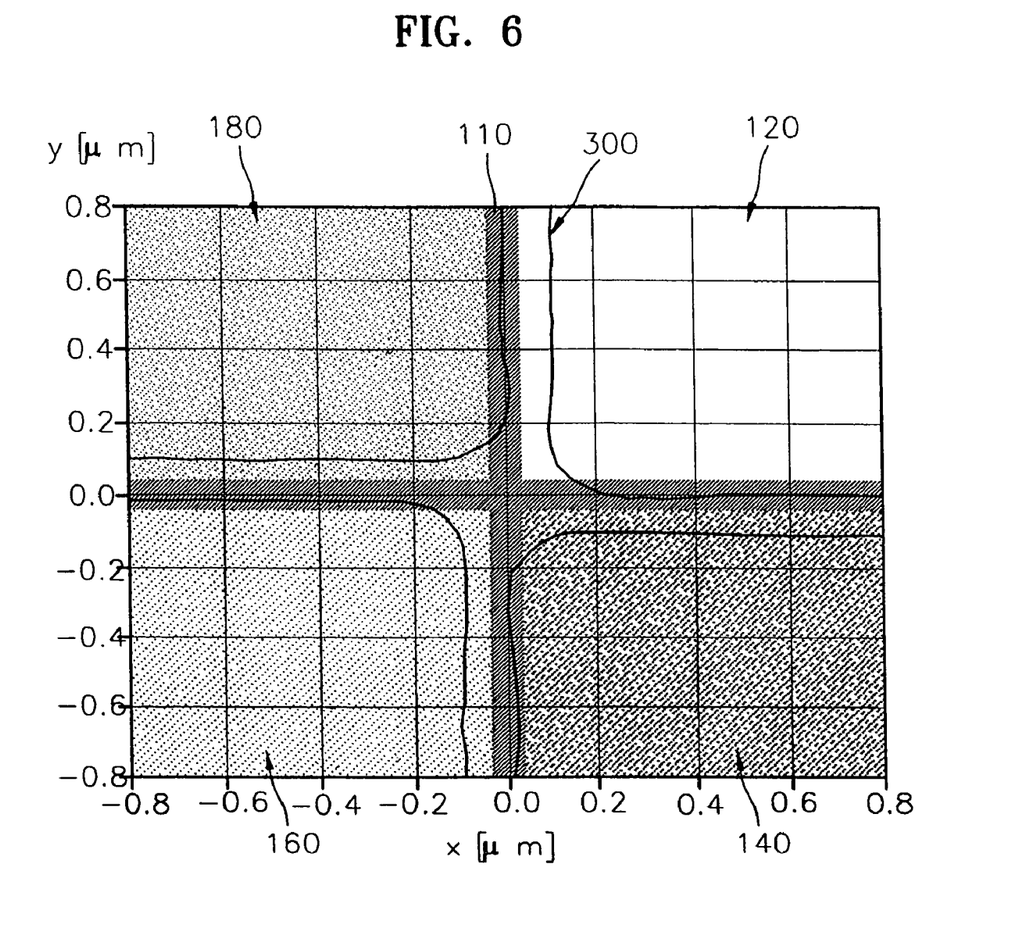
FIGS. 6 through 8 are schematic views showing the shifts of the unit pattern adapted in the photomask, according to the defocus variation to show a method for measuring the focus of the wafer exposure system of the embodiment of the present invention.
Figure 7:
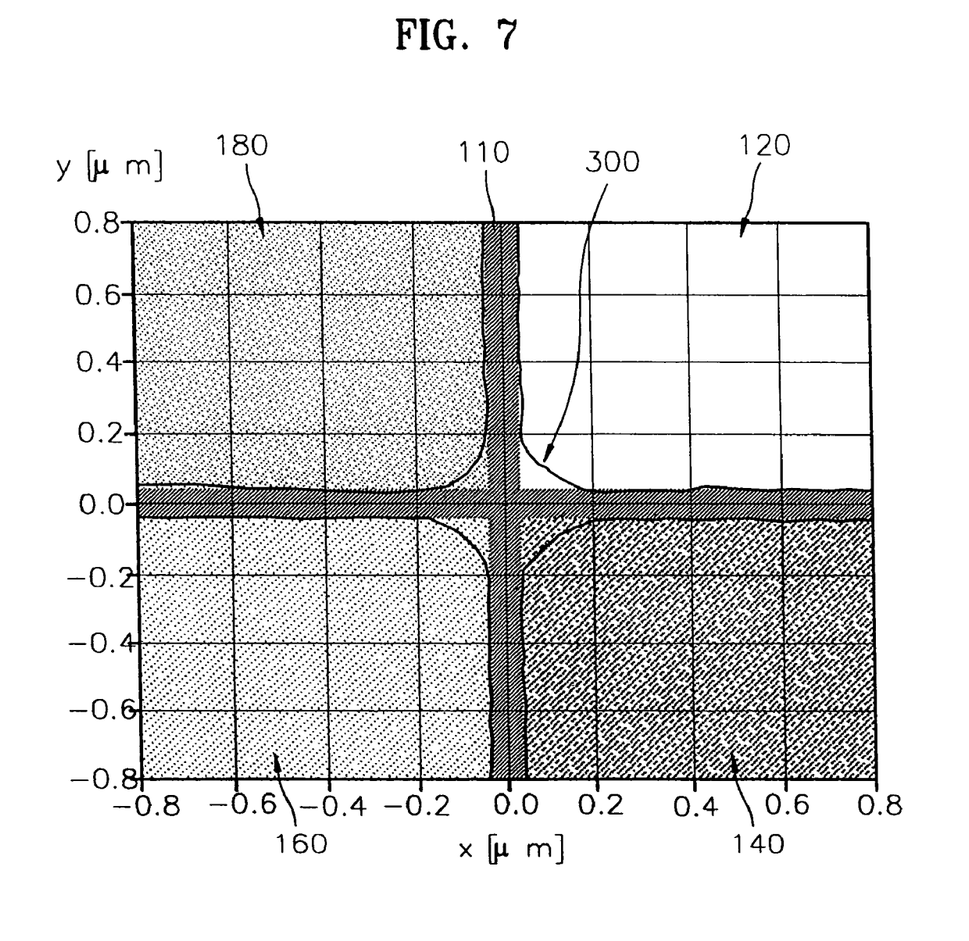
Figure 8:
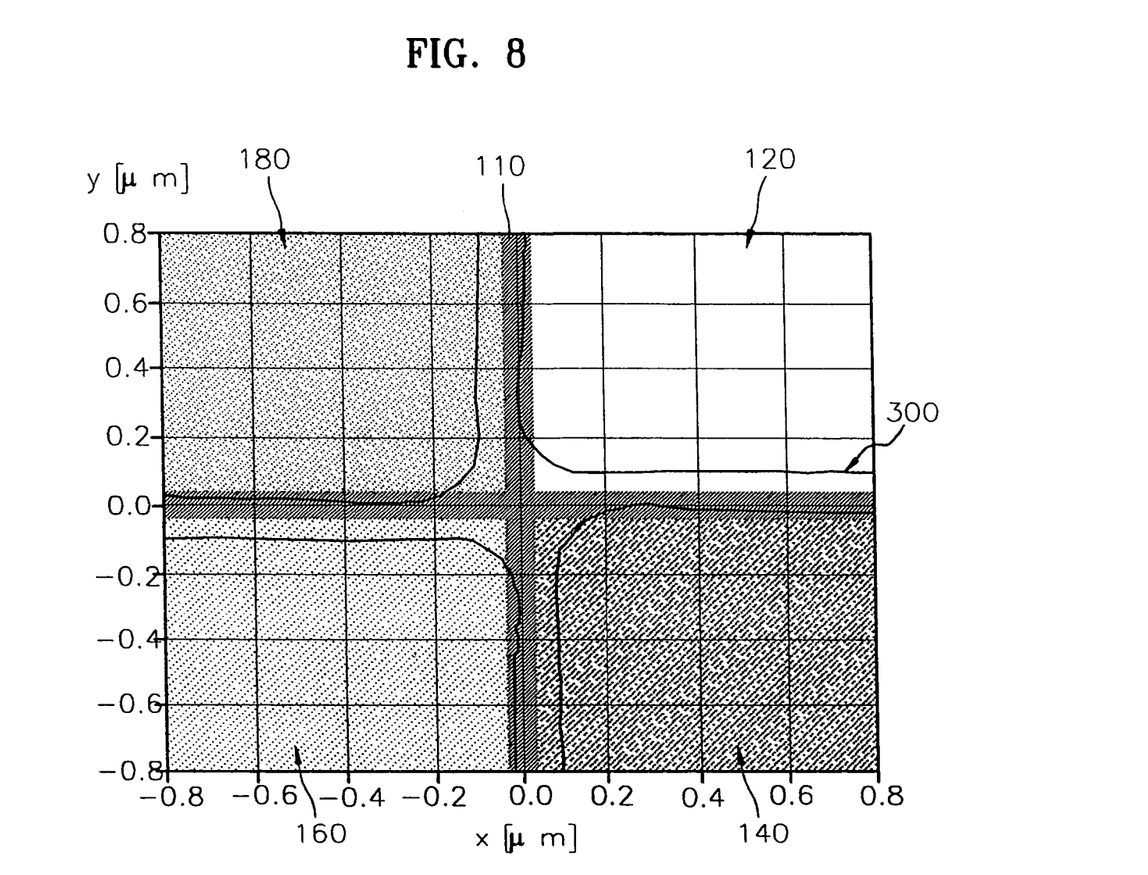

FIG. 6 shows a pattern observed in the case that defocus is set as 0.0 um, FIG. 7 shows a pattern observed in the case that defocus is set as −0.3 um and FIG. 8 shows a pattern observed in the case that a defocus is set as −0.6 um. The numeral "300" in FIGS. 6 through 8 denotes outlines of the real patterns observed in the real patterns 300. The real patterns 300 observed on the wafer show shifts in the patterns according to the focus set in the exposure system.

The real pattern 300 in FIG. 6 is a pattern transferred by the light opaque region pattern (110 in FIG. 2) and the light transmitting region patterns (120, 140, 160 and 180 in FIG. 2). At this time, since the light transmitting region patterns 120, 140, 160, and 180 give a phase difference to the transmitting lights, the patterns 300 on which the light transmitting region patterns 120, 140, 160, and 180 are transferred are shifted according to the degrees of the focus of the exposure system.

As shown in FIGS. 6 through 8, it is possible to number the shifts of the real pattern 300 of the exposure system by focus by measuring the degrees of shifts of the real pattern 300. It is possible to find an optimum focus where a minimum pattern shift occurs. At this time, degrees of the shifts of the pattern 300 are measured by the degree of shift of a vertical/horizontal line of the outlines of the patterns in the up/down or the left/right directions.

Considering only the patterns 300 corresponding to the first light transmitting region pattern 120 as shown in FIGS. 6 through 8, the moves of the patterns 300 are minimized in FIG. 7, comparing to FIGS. 6 and 7. In addition, the pattern 300 in FIG. 6 moves in the right direction, comparing to FIG. 7 and the pattern in FIG. 8 moves in the left direction, comparing to FIG. 7.

Comparing the shifts of the patterns according to the defocus of the exposure system, an optimum focus, where a minimum pattern shift occurs, can be obtained. That is, the defocus value in FIG. 7 is considered as the optimum focus value of the exposure equipment.

Figure 9:
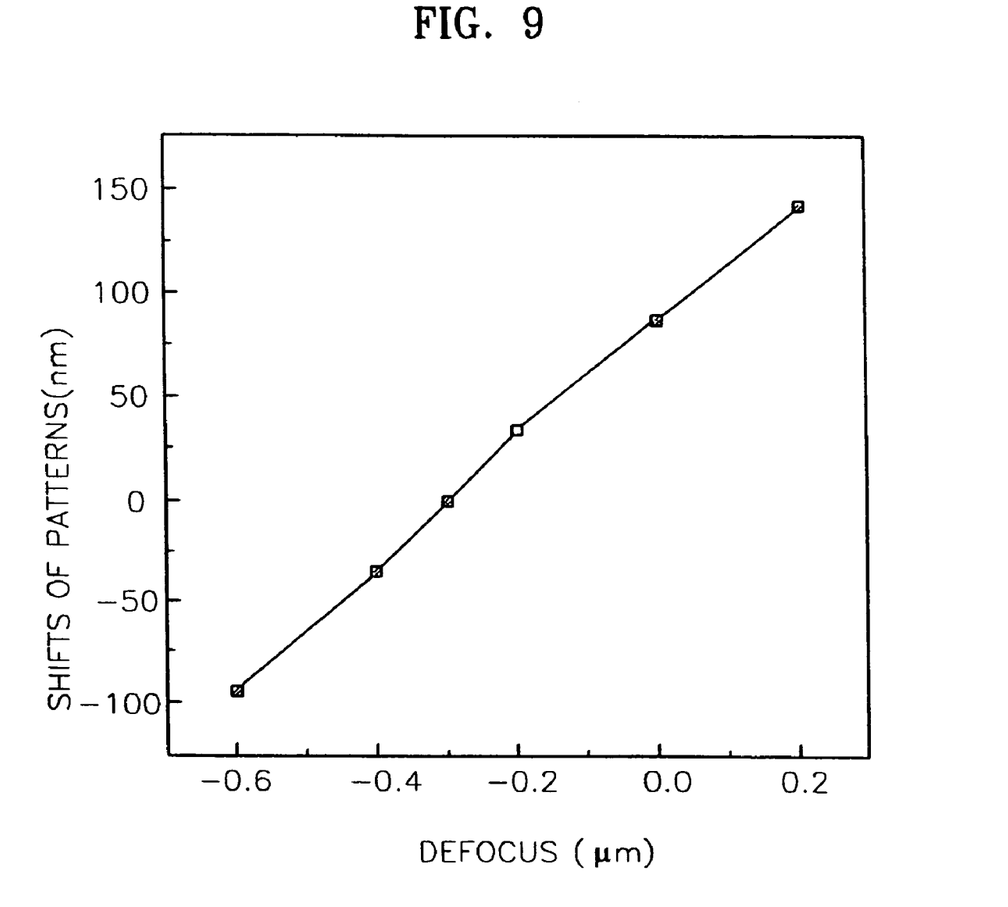
FIG. 9 is a schematic graph showing degrees of the shifts of the pattern according to the defocus variation;.

FIG. 9 is a graph showing movements of the patterns according to the defocus of the exposure system. According to FIG. 9, an optimum focus value of −0.3 um is obtained.

Referring to FIGS. 6 through 9, the method for searching for the optimum focus value of the exposure system is described, considering the movements of the patterns according to the defocus for a measuring unit pattern 100. In addition, if the above measure is performed at each position of a multiple measuring unit patterns 100, a focus map of the exposure system at each position of the measuring unit patterns 100 is also obtained. Thus, the optimum focus value throughout the entire exposure regions is obtained by the focus map.

Using this photomask including the measuring unit pattern 100, it is possible to observe an aberration, specifically, an astigmatism aberration from the degree of shifts of the patterns formed on the wafer. Even though the focus of the exposure system is set as the optimum focus value, a pattern is sometimes shifted into a certain direction. This phenomenon depends on the astigmatism aberration. In a case where the exposure system has an astigmatism aberration, even if the exposure system has optimum focus in one direction, for example, a horizontal direction, and thus has no pattern shift in the direction, a pattern shift may occur in another direction, for example, in a vertical direction because the exposure system dose not have optimum focus in the vertical direction. A degree of shift of the pattern depends on the astigmatism aberration of the exposure system.

The astigmatism aberration of the exposure system can be measured using a photomask including the measuring unit pattern 100 in an embodiment of the present invention. At first, an exposure and a development are performed on the photoresist layer on the wafer according to changes of the focus of the photo exposure equipment, by using the photomask as shown in the embodiments of the present invention. At this time, what is really observed with a scanning electron microscope is a developed wafer, namely, a developed photoresist layer. What is to be observed with the scanning electron microscope is a pattern formed by transferring the measuring unit pattern 100. The patterns formed on the wafer by corresponding to the measuring unit patterns 100 observed by the scanning electron microscope are shown in FIGS. 10 through 13.

Figure 10:
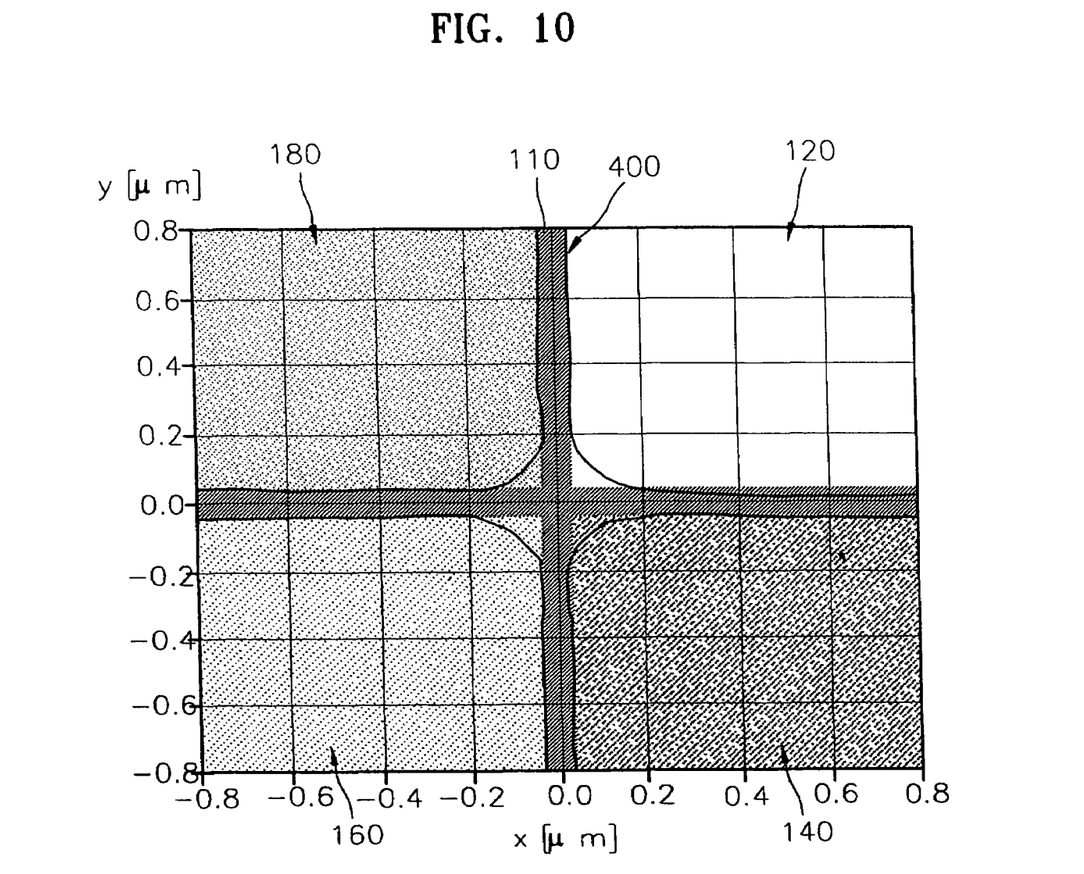
FIGS. 10 through 13 are schematic views showing the shifts of the unit pattern adapted in a photomask according to the variations of lens aberrations of the wafer exposure system to show a method for measuring the degree of lens aberrations of the wafer exposure system according to the embodiment of the present invention.
Figure 11:
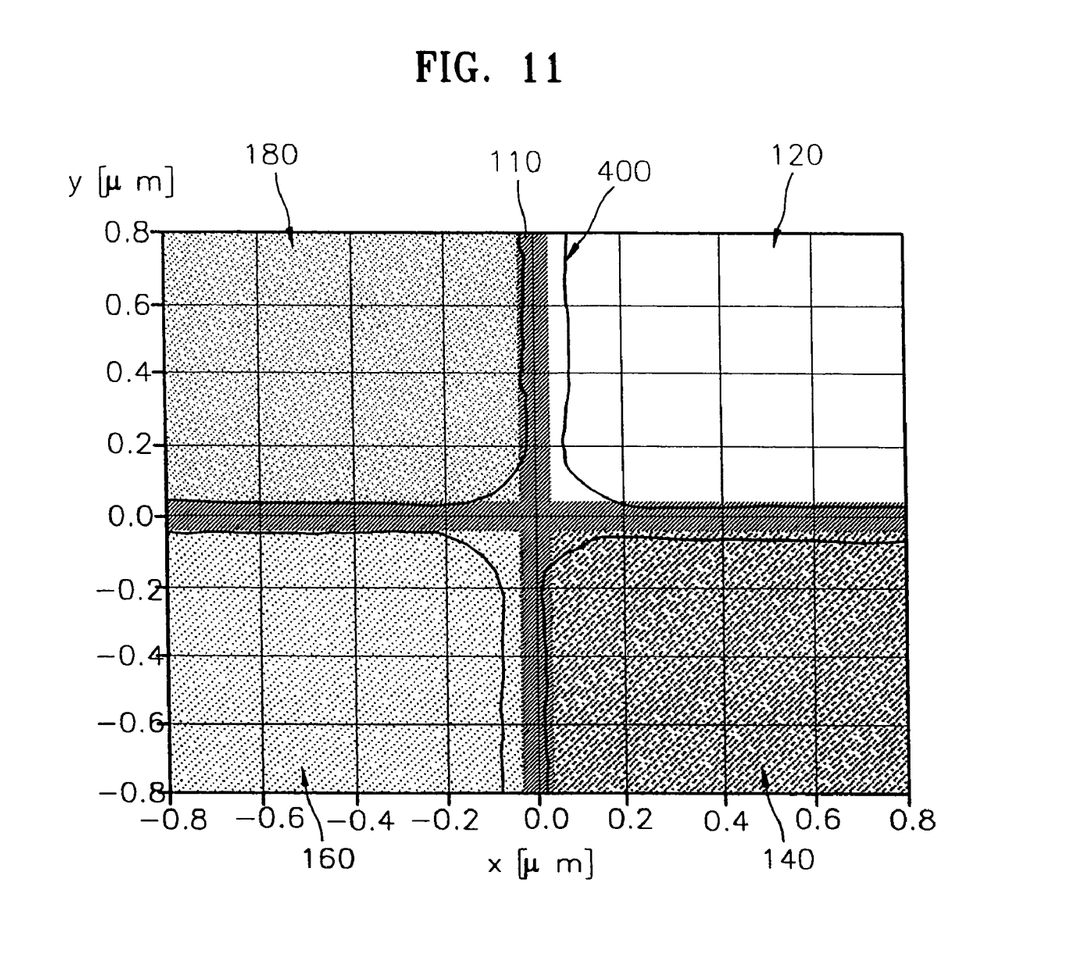
Figure 12:
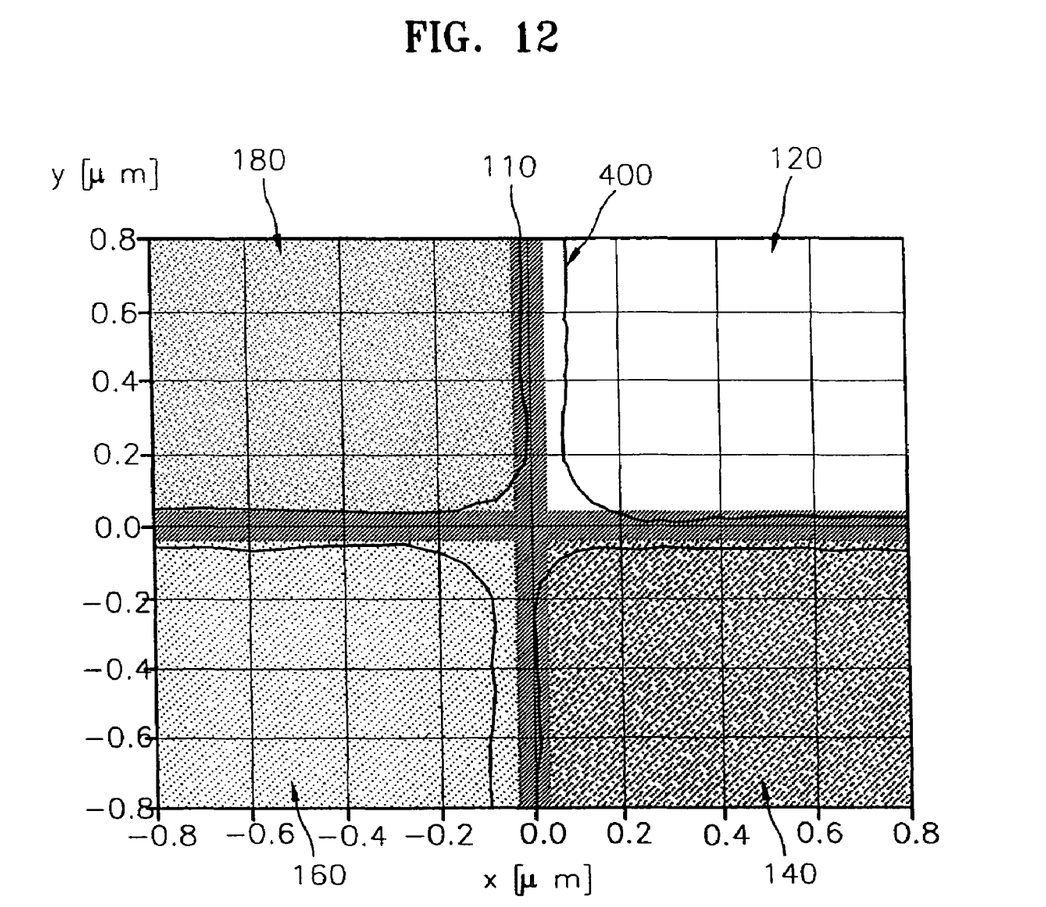
Figure 13:
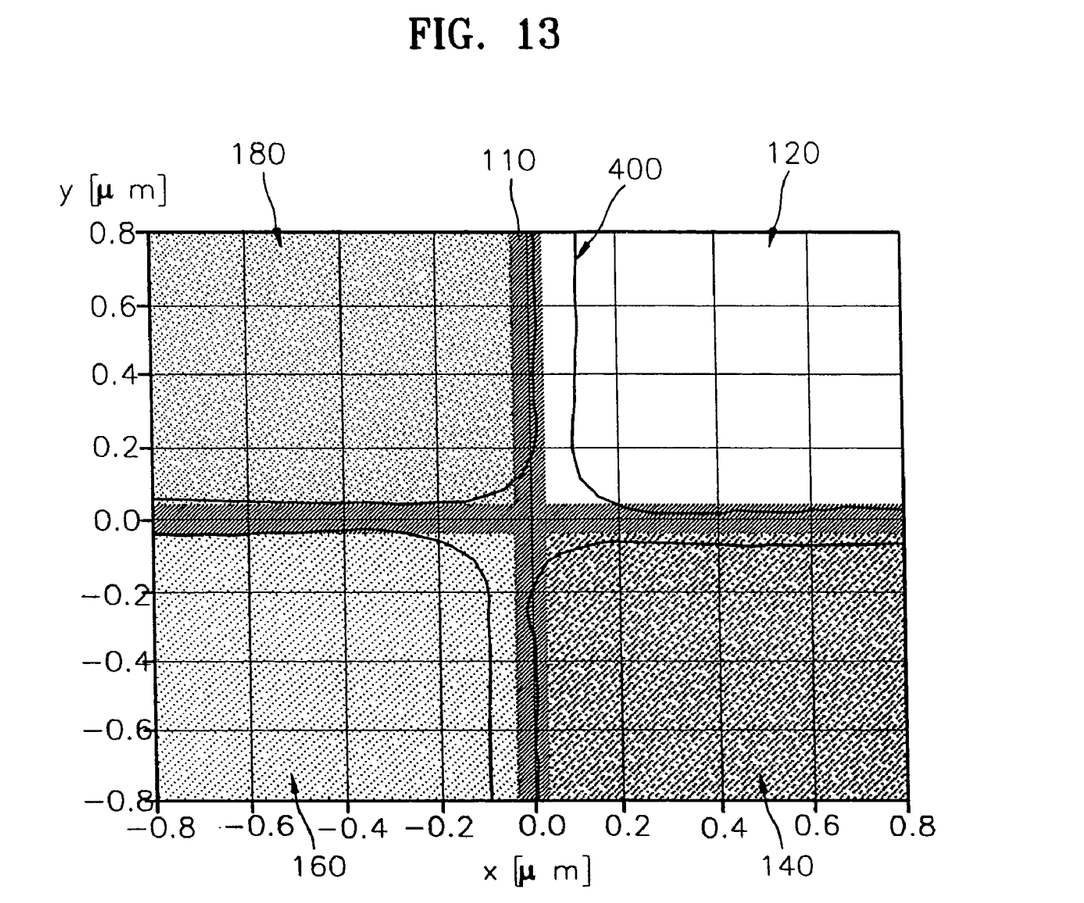

FIG. 10 is a pattern observed when the exposure system has an astigmatism aberration of 0.05λ, FIG. 11 is a pattern observed when the exposure system has an astigmatism aberration of 0.1λ, FIG. 12 is a pattern observed when the exposure system has an astigmatism aberration of 0.15λ and FIG. 13 is a pattern observed when the exposure system has an astigmatism aberration of 0.2λ. The lines denoted as the numeral "400" in FIGS. 10 through 13 are outlines of the real patterns observed on the real wafer. The real pattern 400 observed on the wafer shows changes of the pattern according to the astigmatism aberration in the exposure system in FIGS. 10 through 13.

In FIG. 10, the pattern 400 is a pattern transferred by the light opaque region pattern 110 in FIG. 2 and the light transmitting region patterns 120, 140, 160, and 180 in FIG. 2 of the measuring unit pattern 100. At this time, since the light transmitting region patterns 120, 140, 160, and 180 have a function to give phase differences to the transmitting lights, the pattern 400 transferred by the light transmitting region patterns 120, 140, 160, and 180 are remarkably shifted according to the astigmatism aberration of the exposure system.

As shown in FIGS. 10 through 13, the pattern 400 is rarely shifted in the vertical direction. Accordingly, the exposure system has an optimum focus in the vertical direction. However, as shown in FIGS. 10 through 13, the pattern 400 is shifted in the horizontal direction according to the degree of the astigmatism aberration. Therefore, an optimum astigmatism aberration, where a minimum shift occurs, is obtained by numerically expressing or comparing the shifts of the patterns according to the variation of the astigmatism aberration of the exposure system.

Referring to FIGS. 10 through 13, the method for searching for the optimum astigmatism aberration value of the exposure system is described considering the movements of the patterns according to the variation of the astigmatism aberration for each unit pattern 100. In addition, if the above mentioned measurement is performed at each position of a multiple measuring unit patterns 100, an astigmatism aberration map of the exposure system at each position of the measuring unit patterns 100 is also obtained. Thus, the optimum astigmatism aberration value throughout the entire exposure regions is obtained by the astigmatism aberration map.

As described above, using this photomask including the measuring unit pattern 100, it is possible to observe focus values and aberration values, specifically, astigmatism aberration values from the degrees of shifts of the patterns formed on the wafer. Therefore, it is possible to control the optimum focus and aberration of the exposure system using the measured focus or aberration values and analyze the focus or the aberration of the exposure system during manufacture of a semiconductor device. Thus, this could result in quality improvement of the semiconductor device.

It is noted that the present invention is not limited to the preferred embodiments described above, and it is apparent that variations and modifications can be made by those skilled in the art.

What is claimed is:

1. A photomask comprising:
a substrate; and
a measuring pattern comprising a light opaque region pattern formed on the substrate and a plurality of light transmitting region patterns that are formed in regions divided by the light opaque region pattern, said measuring pattern introducing phase shifts to provide phase differences in light transmitted through the light transmitting region patterns, each light transmitting region pattern having a single depth being different than the depth of each of the other light transmitting region patterns.

2. The photomask of claim 1, wherein a plurality of the measuring patterns are disposed on the substrate.

3. The photomask of claim 1, wherein the light opaque region patterns are made of chrome layers.

4. The photomask of claim 1, wherein the phase difference is 90°.

5. A photomask comprising:
a substrate; and
a measuring pattern comprising a light opaque region pattern in a cross-shape formed on the substrate and four light transmitting region patterns that are formed in four quadrants, respectively, divided by the light opaque region pattern, said measuring pattern introducing phase shifts to provide phase differences in light transmitted through the light transmitting region patterns, each light transmitting region pattern having a single depth being different than the depth of each of the other light transmitting region patterns.

6. The photomask of claim 5, wherein a plurality of the measuring patterns are disposed on the substrate.

7. The photomask of claim 5, wherein the light opaque region patterns are made of chrome layers.

8. The photomask of claim 5, wherein the phase difference is 90°.

9. The photomask of claim 1, wherein one of the light transmitting region patterns is composed of a surface of one quadrant of the substrate and the other light transmitting region patterns are made of grooves with different depths on the other quadrants of the substrate.

10. A method for manufacturing a photomask, the method comprising:
forming a light opaque region pattern on a substrate; and
forming a measuring pattern that comprises a light opaque region pattern and light transmitting region patterns by forming a plurality of light transmitting region patterns that are formed in the regions divided by the light opaque region pattern, said measuring pattern introducing phase shifts to provide the phase differences in the light transmitted through the light transmitting region patterns, each light transmitting region pattern having a single depth being different than the depth of each of the other light transmitting region patterns.

11. The method of claim 10, wherein a plurality of the measuring patterns are disposed on the substrate.

12. A method for manufacturing a photomask, comprising:
forming a cross-shaped light opaque region pattern on the substrate; and
forming a measuring pattern that comprises four light transmitting region patterns formed in four quadrants divided by the light opaque region pattern, said measuring pattern introducing phase shifts to provide phase differences in the light transmitted through the light transmitting region patterns, each light transmitting region pattern having a single depth being different than the depth of each of the other light transmitting region patterns.

13. The method of claim 12, wherein a plurality of the measuring patterns are disposed on the substrate.

14. The method of claim 12, wherein the forming the light transmitting region patterns comprises:
setting one of the four quadrants as a light transmitting region pattern; and
sequentially etching portions of the other quadrants of the substrate to different thicknesses to sequentially form other light transmitting region patterns with grooves having different depths.

* * * * *